United States Patent [19]

Lesser

[11] 4,042,833
[45] Aug. 16, 1977

[54] IN-BETWEEN PHASE CLAMPING CIRCUIT TO REDUCE THE EFFECTS OF POSITIVE NOISE

[75] Inventor: Mark B. Lesser, Laguna Niguel, Calif.

[73] Assignee: Rockwell International Corporation, El Segundo, Calif.

[21] Appl. No.: 717,713

[22] Filed: Aug. 25, 1976

[51] Int. Cl.² .................. H03K 17/16; H03K 19/08; H03K 17/60; H03K 5/08
[52] U.S. Cl. .............................. 307/200 B; 307/205; 307/221 C; 307/237
[58] Field of Search ................... 307/200 B, 205, 208, 307/220 C, 221 C, 237, 269, 270; 328/165

[56] References Cited

U.S. PATENT DOCUMENTS

| | | | |
|---|---|---|---|
| 3,567,968 | 3/1971 | Booher | 307/205 X |
| 3,579,275 | 5/1971 | Polkinghorn et al. | 307/208 X |
| 3,631,261 | 12/1971 | Heimbigner | 307/208 X |
| 3,646,369 | 2/1972 | Fujimoto | 307/205 X |
| 3,708,688 | 1/1973 | Yao | 307/208 X |
| 3,774,053 | 11/1973 | Carlson | 307/237 |

Primary Examiner—John S. Heyman
Assistant Examiner—Larry N. Anagnos
Attorney, Agent, or Firm—H. Fredrick Hamann; G. Donald Weber, Jr.; Morland Charles Fischer

[57] ABSTRACT

An improved MOS clamping circuit compatible with a multi-phase, major-minor clocking scheme. The present circuit is adapted to clamp the output terminal of a conventional major logic gate to a negative signal level. The instant clamping circuit prevents the deterioration of the logic gate output signal as a consequence of positive noise during the minor clock phases and during an in-between clock phase, which phase corresponds to the interval of time between the occurrence of first and second major clock phases.

8 Claims, 2 Drawing Figures

IN-BETWEEN PHASE CLAMPING CIRCUIT TO REDUCE THE EFFECTS OF POSITIVE NOISE

BACKGROUND OF THE INVENTION

1. Field of the Invention

This invention relates to an improved in-between phase clamping circuit compatible with a multi-phase, major-minor clocking scheme to reduce the effects of positive noise.

2. Prior Art

Integrated circuit field effect transistor (FET) logic circuits, which are strobed by a four-phase, major-minor clocking scheme can be arranged to form six basic logic gates. One logic gate, commonly designated as a type 2 logic gate (which precharges when multi-phase clock-signal $\phi_1$ is true and discharges or evaluates when multi-phase clock signal $\phi_2$ is true), and a second logic gate, commonly designated as a type 4 logic gate (which precharges during $\phi_3$ and evaluates during $\phi_4$), are referred to as major logic gates by those skilled in the art, inasmuch as each gate evaluates during major clock phases $\phi_2$ and $\phi_4$, respectively. For a more detailed description of major logic gate types 2 and 4, reference may be made to U.S. Pat. No. 3,601,627 issued Aug. 24, 1971, and to U.S. application Ser. No. 659,057 filed Feb. 18, 1976.

Positive noise is a well-known problem associated with the utilization of the aforementioned type 2 and 4 major logic gates. That is, the output signal of these major gates is susceptible to the effects of positive noise during minor clock phases 1 and 3 and during in-between clock phases, when the major gates are holding or storing information. The in-between clock phases correspond to the intervals of time between the occurrence of first and second major clock phases. Such undesirable noise typically results as a consequence of capacitive coupling between type 2 and 4 logic gates with other logic gates and during the negative transition of the multi-phase clock signal generator. Positive noise at the output terminal of a logic gate may result in the deterioration of a negative output signal to a level where relatively negative and positive output signals become indistinguishable from one another.

Reference can be made to U.S. Pat. No. 3,567,968 issued Mar. 2, 1971 and U.S. Pat. No. 3,774,053 issued Nov. 20, 1973, for examples of prior art circuits which eliminate the effects of noise in multi-phase field effect transistor logic circuits. However, no circuits are known which reduce the effects of positive noise during both the minor clock phases and the in-between clock phase of a four phase major-minor scheme.

SUMMARY OF THE INVENTION

Briefly, and in general terms, this invention relates to an improved metal oxide semiconductor field effect transistor (MOSFET) clamping circuit that is compatible with a conventional four-phase, major-minor clocking scheme. The improved clamping circuit is connected to the output terminal of a major logic gate, which gate evaluates during one of the clock phases 2 or 4. During an in-between clock phase, which corresponds to the interval of time between the occurrence of the major clock phases, the output terminal of a major logic gate is holding (i.e. storing) information. However, a relatively negative output signal is undesirably susceptible to the effects of positive noise during the in-between clock phase. Positive noise acts to reduce the negative level of the output signal, until it becomes substantially indistinguishable from a relatively positive signal level (e.g. ground). The improved noise clamping circuit of the present invention clamps the output terminal of a major logic gate to a negative level (e.g. one threshold level more positive than the negative source voltage) during the in-between clock phase to, thereby, eliminate the adverse effects of positive noise and to prevent the output signal from becoming subject to deterioration during that time when the logic gate is holding information.

DESCRIPTION OF THE PREFERRED EMBODIMENT

Figure 1:
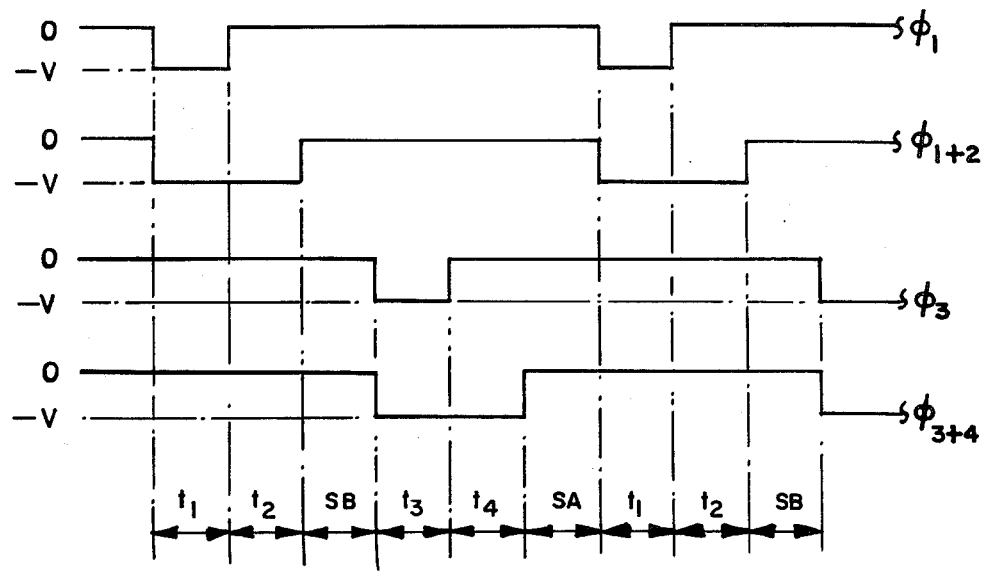
FIG. 1 illustrates the waveforms of a conventional four-phase, major-minor clocking scheme utilized to drive the presently improved clamping circuit.

FIG. 1 is illustrative of the waveforms for a well-known four-phase, major-minor clocking scheme which is utilized to strobe the improved in-between phase clamping circuit of the instant invention. The waveform of each multi-phase clock signal $\phi_1$, $\phi_{1+2}$, $\phi_3$, and $\phi_{3+4}$ has relatively HI (i.e. true) and LOW (i.e. false) reference signal levels corresponding, for example, to $-V$ volts and ground, respectively. $\phi_{1+2}$ and $\phi_{3+4}$ are designated as major clock phases. The intervals occurring between the major clock phases, SA and SB, are designated as in-between clock phases, and the reference level of each of the multiphase clock signals is relatively LOW.

Figure 2:
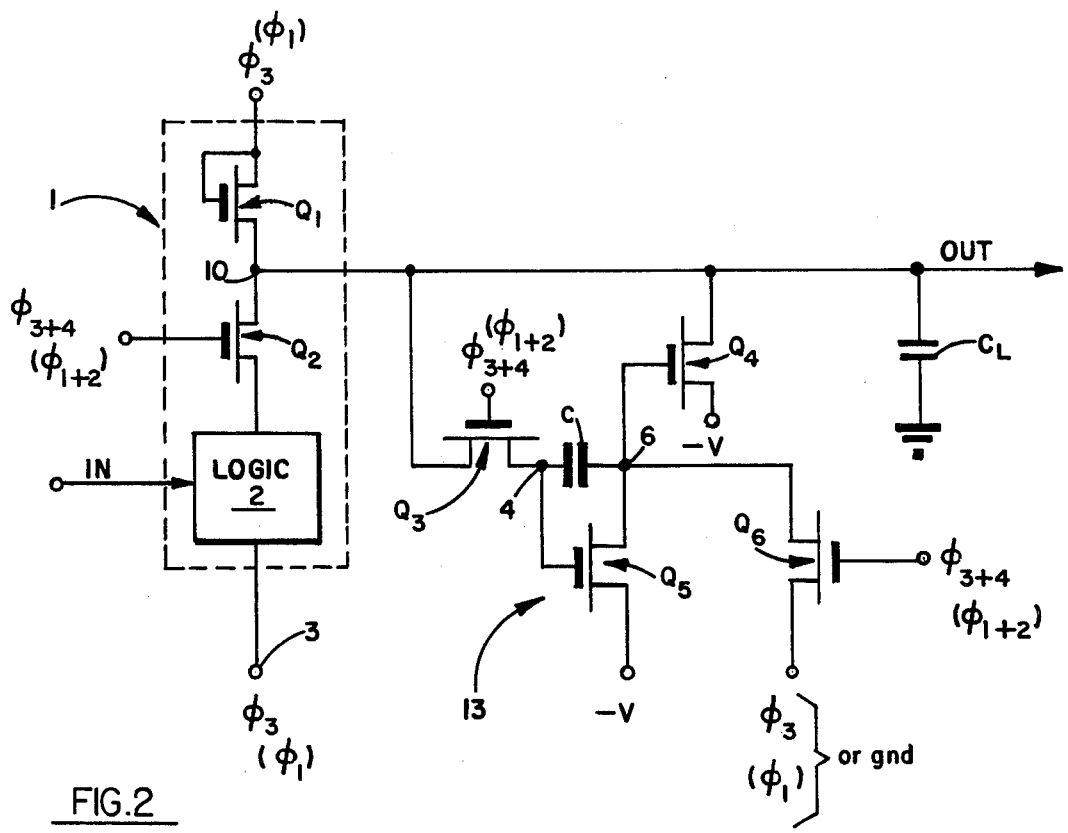
FIG. 2 shows an implementation of the present clamping circuit connected to the output terminal of a major logic gate to eliminate the effects of positive noise.

FIG. 2 shows a preferred implementation of the present in-between phase clamping circuit 13. The circuit is comprised of p-channel metal oxide semiconductor field effect transistors (MOSFETs), although it is to be understood that any other suitable semiconductor device may be employed as well. In a first embodiment, the clamping circuit 13 is connected to the output terminal of a well-known type "4" major logic gate 1. Briefly, major logic gate 1 includes first and second FETs $Q_1$ and $Q_2$. The control (i.e. gate) and one conduction path electrode of FET $Q_1$ are connected together and to one terminal of a multi-phase clock signal generator (not shown) to receive the $\phi_3$ signal of FIG. 1. The second conduction path electrode of FET $Q_1$ and a first conduction path electrode of FET $Q_2$ are connected together at a common electrical junction 10 formed with the output terminal of logic gate 1. The gate electrode of FET $Q_2$ is connected to a terminal of the clock signal generator to receive the $\phi_{3+4}$ signal of FIG. 1. Suitable control logic 2 is connected between the second conduction path electrode of FET $Q_2$ and a terminal 3 of the multi-phase clock signal generator which supplies the signal $\phi_3$. Logic 2 may be any convenient arrangement of semiconductor devices, connected in series or parallel, as is well known to those skilled in the art. Suitable input terminal means of gate 1 is connected to the logic arrangement 2.

In accordance with the instant invention, the improved clamping circuit 13 includes an isolation FET $Q_3$ having its conduction path electrodes connected between common electrical junction 10 and a first reference node 4. The gate electrode of isolation FET $Q_3$ is connected to a terminal of the multi-phase clock signal generator to receive the signal $\phi_{3+4}$. A clamping FET $Q_4$ has its conduction path electrodes connected between common electrical junction 10 and a suitable source of d.c. voltage, designated $-V$. The gate electrode of FET $Q_4$ is connected to a second reference node 6. A FET $Q_5$ has its conduction path electrodes connected between reference node 6 and voltage source $-V$. The gate electrode of FET $Q_5$ is connected to reference node 4. A capacitor C is connected between reference nodes 4 and 6 so as to bootstrap FET $Q_5$. A FET $Q_6$ has its conduction path electrodes connected between reference node 6 and a terminal of the multi-phase clock signal generator to receive the signal $\phi_3$ when it is desirable for the clock generator to draw d.c. current. In the event that it is not desirable for the clock signal generator to draw current, the drain electrode of FET $Q_6$ is, otherwise, connected to a source of reference potential, such as ground. The gate electrode of FET $Q_6$ is connected to a terminal of the multi-phase clock signal generator to receive the signal $\phi_{3+4}$. Suitable load capacitance means $C_L$ is connected to the output terminal of logic gate 1.

Referring concurrently to FIGS. 1 and 2, the operation of the presently improved clamping circuit 13 is described as follows. During the precharge time interval of logic gate 1, designated $t_3$, the clock signal generator applies relatively HI signals to the gate electrodes of FETs $Q_1$, $Q_2$, $Q_3$ and $Q_6$. As a result, FETs $Q_1$, $Q_2$, and $Q_6$ are rendered conductive. FET $Q_5$ is also rendered conductive during the precharge interval, inasmuch as the gate electrode thereof is connected to reference node 4, which node receives a suitable enabling signal via the conduction paths of FETs $Q_1$ and $Q_3$. Moreover, clamping FET $Q_4$ is also rendered conductive, inasmuch as the gate electrode thereof is connected to reference node 6, which node receives a suitable enabling signal via the conduction path of FET $Q_5$. Should the drain electrode of FET $Q_6$ be connected to ground during time $t_3$, a d.c. current path is established from the voltage source $-V$ through the series connected conduction paths of FETs $Q_5$ and $Q_6$. Hence, during the precharge interval of time, $t_3$, the output terminal of logic gate 1 is precharged to one threshold level, $V_t$, less negative than the source voltage, $-V$, via the conduction path of FET $Q_4$.

During the evaluation time interval of major logic gate 1, designated $t_4$, the clock signal generator applies a relatively LOW signal to the gate electrode of FET $Q_1$. Therefore, FET $Q_1$ is rendered nonconductive. During the same $t_4$ interval, the clock signal generator applies relatively HI signals to the gate electrode of FETs $Q_2$, $Q_3$ and $Q_6$, whereby each of these aforementioned transistors remains in the conductive condition. As a first example, if a signal is applied to the input terminal means of major gate 1 so as to disable logic 2 (i.e. disconnect clock terminal 3 from the conduction path of FET $Q_2$), reference node 4 remains at the precharge level (e.g. $-V + V_t$) via the conduction path of FET $Q_3$. Therefore, FET $Q_5$ remains in the conductive condition, inasmuch as the gate electrode thereof is connected to reference node 4. Moreover, reference node 6 is clamped to ground via the conduction path of FET $Q_6$, whereby bootstrap capacitor C is charged. Therefore, FET $Q_4$ is rendered non-conductive, inasmuch as the gate electrode thereof is connected to reference node 6. Thus, in this first example, the output terminal of logic gate 1 remains at its precharge voltage ($-V + V_t$) during the $t_4$ evaluation interval. In addition, if the drain electrode of FET $Q_6$ is connected to the $\phi_3$ terminal of the clock signal generator (rather than to ground), d.c. current is drawn to the clock signal generator via the current path formed by FETs $Q_5$ and $Q_6$. Therefore, FET $Q_5$ may be selected to have a high impedance (relative to FET $Q_6$) in order to limit the current to the clock signal generator.

As a second example, if an enabling signal is applied to the input terminal means of major logic gate 1 during the $t_4$ evaluation interval so as to, thereby, complete the path formed between clock terminal 3 and FET $Q_2$, reference node 4 is clamped to ground at clock terminal 3 via the conduction paths of FETs $Q_3$ and $Q_2$ and logic 2. Therefore, FET $Q_5$ is rendered non-conductive, inasmuch as the gate electrode thereof is connected to reference node 4. Reference node 6 is also clamped to ground via the conduction path of FET $Q_6$. Therefore, FET $Q_4$ is rendered non-conductive, inasmuch as the gate electrode thereof is connected to reference node 6. Thus, in this second example relating to the $t_4$ evaluation interval, the output terminal of logic gate 1 is discharged (to ground) at clock terminal 3 via the conduction path of FET $Q_2$ and logic 2. What is more, during the $t_4$ interval, the voltage of reference node 4 tracks that of the logic gate output terminal (via FET $Q_3$), and reference node 6 is clamped to ground (via FET $Q_6$), regardless of the signal that is applied to the input terminal means of gate 1.

During the interval of time, designated SA, occurring between the $t_4$ and the succeeding $t_1$ interval of the next four-phase clock cycle, the clock signal generator applies relatively LOW signals to the gate electrode of FETs $Q_1$, $Q_2$, $Q_3$ and $Q_6$, whereby each of these aforementioned transistors is rendered non-conductive. Hence, reference node 4 is disconnected from the output terminal of logic gate 1, inasmuch as isolation FET $Q_3$ is rendered non-conductive during the SA time interval. As a result, thereof, the particular signal (either $-V + V_t$ or ground) at the output terminal of gate 1 during the $t_4$ evaluation interval is stored (i.e. held) by reference node 4 during the SA interval. The signal stored by node 4 is, thereupon, applied to the gate electrode of FET $Q_5$ to control the conductivity thereof.

If, during the SA interval, reference node 4 is held at ground (in that the logic gate output terminal is discharged during the preceding $t_4$ evaluation interval), reference node 6 remains at ground, because FET $Q_6$ is rendered non-conductive, as previously disclosed. FET $Q_5$ is rendered non-conductive, inasmuch as the gate electrode thereof is connected to node 4. Similarly, FET $Q_4$ is rendered non-conductive, inasmuch as the gate electrode thereof is connected to node 6. Therefore, the output terminal of logic gate 1 remains discharged (to ground) during the SA in-between clock interval.

If, however, during the SA interval a negative signal ($-V + V_t$) is stored at reference node 4 (in that the logic gate output terminal remains at the precharge level during the preceding $t_4$ evaluation interval), FET $Q_5$ remains in the conductive condition. Bootstrap capacitor C, which is charged during the $t_4$ evaluation interval, as previously disclosed, applies an additional feedback signal to the gate electrode of FET $Q_5$. This enables a sufficiently boosted negative signal to be supplied to the gate electrode of FET $Q_5$, whereby FET $Q_5$ turns on hard (i.e. the threshold voltage drop across the conduction path electrodes thereof is substantially eliminated). Thus, node 6 is driven to the full −V source voltage via the conduction path of FET Q₅. FET Q₄ is, thereupon, rendered conductive, inasmuch as the gate electrode thereof is connected to reference node 6. As known to those skilled in the art, a negative output signal from a major logic gate is most susceptible to the adverse effects of positive noise during both the minor clock phases, φ₁ and φ₃, and the in-between clock phases, SA and SB. Therefore, by virtue of the presently disclosed clamping circuit 13, the output terminal of logic gate 1 is clamped to −V + V_t via the conduction path of FET Q₄ so as to prevent the deterioration of the output signal as a consequence of positive noise during the SA in-between clock interval.

During each of the following t₁, t₂ and SB time intervals, the clock signal generator continues to apply relatively LOW signals to the gate electrode of FETs Q₁, Q₂, Q₃ and Q₆, whereby each of these aforementioned transistors continues to a non-conductive condition. Reference node 4 continues to be disconnected from the output terminal of logic gate 1, inasmuch as isolation FET Q₃ is rendered non-conductive. Therefore, as in the preceding SA interval, the signal supplied to the output terminal of logic gate 1 during the t₄ evaluation interval is also held by reference node 4 during the subsequent t₁, t₂ and SB intervals. Moreover, the voltage of reference node 6 continues to track the signal held by reference node 4. What is more, in the event that a relatively negative signal is held by node 4 during the SA in-between interval, the instant clamping circuit 13 maintains the clamp of the logic circuit output terminal at −V + V_t via the conduction of path of FET Q₄ during each of the following t₁, t₂ and SB intervals so as to, thereby, continue to eliminate the undesirable effects of positive noise.

It will be apparent that while a preferred embodiment of the invention has been shown and described, various modifications and changes may be made without departing from the true spirit and scope of the invention. For example, a conventional type "2" major logic gate can be substituted for the type "4" logic gate 1, as shown, and the presently described clamping circuit 13 can be suitably connected to the output terminal thereof by exchanging a (φ₁) clock signal for the illustrated φ₃ clock signal and a (φ₁₊₂) clock signal for the illustrated φ₃₊₄ clock signal at the respective terminals of the multi-phase clock signal generator.

I claim:

1. A circuit to reduce the effects of positive noise at the output terminal of a signal supply means, said circuit including:
   source means to provide a plurality of reference potentials;
   clock terminal means;
   electrical junction means;
   a first multi-terminal semiconductor device having conduction path terminals connected between said source means and said output terminal and a control terminal connected to said electrical junction means;
   a second multi-terminal semiconductor device having conduction path terminals connected between said source means and said electrical junction means to selectively control the conductivity of said first semiconductor device; and
   a third multi-terminal semiconductor device having conduction path terminals connected between said output terminal and a control terminal of said second semiconductor device to control the conductivity of said second device, and a control terminal thereof connected to said clock terminal means;
   said first semiconductor device responsive to a signal at said electrical junction means to drive said output terminal to a first of said plurality of reference potentials via the conduction path of said first device during a first clock time interval when said third semiconductor device is enabled and to clamp said output terminal at said first reference potential during a second clock time interval when said third semiconductor device is disabled and said output terminal is susceptible to positive noise.

2. The circuit recited in claim 1, wherein each of said first, second, and third semiconductor devices is a metal oxide semiconductor field effect transistor.

3. The circuit recited in claim 1, including a fourth multi-terminal semiconductor device having conduction path terminals connected between said electrical junction means and said clock terminal means and a control terminal connected to said clock terminal means to receive an enabling signal during said first clock time interval and a disabling signal during said second clock time interval.

4. The circuit recited in claim 1, including a fourth multi-terminal semiconductor device having conduction path terminals connected between said electrical junction means and said source means to receive a second of said plurality of reference potentials and a control terminal connected to said clock terminal means to receive an enabling signal during said first clock time interval and a disabling signal during the second clock time interval.

5. The circuit recited in claim 1, including a bootstrap capacitor connected between said electrical junction means and the control terminal of said second semiconductor device to provide a feedback signal to said second semiconductor device and thereby control the conductivity thereof.

6. The circuit recited in claim 1, wherein said clock terminal means is connected to receive four-phase clock signals.

7. The circuit recited in claim 6, wherein said four-phase clock signals provide said first reference potential during said first clock time interval and said second reference potential during said second clock time interval;
   said first clock time interval corresponding to a first major clock phase of said four-phase clock signals; and
   said second clock time interval corresponding to a second major clock phase of said four-phase clock signals and to an in-between clock phase occurring between the first and second major clock phases.

8. In combination:
   source means to provide first and second reference potentials;
   gate means having input and output terminal means;
   circuit means including a driver transistor connected between said source means and said gate means output terminal means;
   clock terminal means to receive multi-phase clock signals connected to strobe said circuit means;
   said driver transistor enabled during a precharge clock phase to drive said output terminal means to said first reference potential;
   said driver transistor disabled and said output terminal means discharged to said second reference potential during an evaluation clock phase; and
   said driver transistor enabled during an information holding clock phase and adapted to clamp said output terminal means to said source means and to said first reference potential when said gate means is inactivated.

* * * * *